(12) United States Patent
Morikawa et al.

(10) Patent No.: US 6,373,081 B1
(45) Date of Patent: Apr. 16, 2002

(54) FIELD EFFECT TRANSISTOR AND METHOD OF FABRICATING THE SAME

(75) Inventors: Junko Morikawa; Hidemasa Takahashi; Kazunori Asano, all of Tokyo (JP)

(73) Assignee: NEC Corporation, Tokyo (JP)

( * ) Notice: Subject to any disclaimer, the term of this patent is extended or adjusted under 35 U.S.C. 154(b) by 900 days.

(21) Appl. No.: 08/630,128

(22) Filed: Apr. 10, 1996

(30) Foreign Application Priority Data

Apr. 20, 1995 (JP) .............................................. 7-095249

(51) Int. Cl.⁷ .............................................. H01L 29/80
(52) U.S. Cl. ........................ 257/280; 257/281; 257/284
(58) Field of Search ................ 257/255, 284, 257/627, 628

(56) References Cited

U.S. PATENT DOCUMENTS 4,791,471 A * 12/1988 Onodera et al. ............... 357/60
4,889,827 A * 12/1989 Willer .......................... 437/41

OTHER PUBLICATIONS

Groded Channel FET's: Improved Linearity and Noise Figure IEEE Trans. Electron Devices 25 600 (1978) Williams et al.*

"Piezoelectric Effects in GaAs FET's and Their Role in Orientation–Dependent Device Characteristics," Peter M. Asbeck et al., IEEE Transactions on Electron Devices, vol. ED–31, No. 10, pp. 1377–1380, Oct. 1984.

"Graded Channel FET's: Improved Linearity and Noise Figure," R. E. Williams et al., IEEE Transactions on Electron Devices, vol. ED–25, No. 6, pp. 600–605, Jun. 1978.

* cited by examiner

Primary Examiner—Olik Chaudhuri
Assistant Examiner—Douglas A. Wille
(74) Attorney, Agent, or Firm—Young & Thompson

(57) ABSTRACT

A field effect transistor includes (a) a semi-insulating GaAs substrate, (b) a step-doped structured active layer including an n type GaAs layer deposited on the substrate, and an n⁻ type GaAs layer or a non-doped GaAs layer deposited on the n type GaAs layer, the n⁻ type GaAs layer or non-doped GaAs layer being formed with at least one recess, and (c) a gate electrode formed in the recess so that the gate electrode is oriented in such a direction that drain current runs in the active layer along crystal orientation [01(−1)]. The field effect transistor enhances linearity of transfer conductance, and further improves strain characteristic.

9 Claims, 3 Drawing Sheets

FIELD EFFECT TRANSISTOR AND METHOD OF FABRICATING THE SAME

BACKGROUND OF THE INVENTION

1. Field of the Invention

The invention relates to a field effect transistor (FET) and a method of fabricating the same, and more particularly to a field effect transistor having a gate electrode oriented along a specific direction, and a method of fabricating the same.

2. Description of the Prior Art

As illustrated in FIG. 1, a conventional field effect transistor (hereinafter, referred to simply as "FET") comprises a semi-insulating GaAs substrate 1, a non-doped GaAs layer 2 formed on the substrate 1, an n type GaAs layer 3 formed on the non-doped GaAs layer 2 with a thickness of about 200 nm and a dose of about $2.0 \times 10^{17}$ cm$^{-3}$ impurities, and an n$^+$ GaAs layer 5 is formed on the n type GaAs layer 3 with a thickness of about 100 nm and a higher dose than the n type GaAs layer 3, which is about $1.0 \times 10^{18}$ cm$^{-3}$. These epitaxial layers are grown by molecular beam epitaxy (MBE).

Then, the n$^+$ type GaAs layer 5 and the n type GaAs layer 3 are selectively wet-etched to thereby form a recess therein in order to enhance break down voltage of FET. On a surface of the n type GaAs layer 3 constituting a bottom surface of the recess is formed a gate electrode 6 made of material such as WSi making Schottky-junction, and on the n$^+$ type GaAs layer 5 are formed a source electrode 7 and a drain electrode 8 both made of an AuGe/Ni film and both making an ohmic junction. Exposed surfaces of these layers 3 and 5, the source and drain electrodes 7 and 8, and the gate electrode 6 are covered with a passivation film 9 made of material such as silicon dioxide.

FIG. 2 illustrates crystal orientation of a semi-insulating GaAs substrate. As illustrated, the gate electrode 6 is formed so that it is oriented with respect to a gate width-wise direction in crystal orientation [01(-1)]. Herein, "(-1)" means a negative direction in Z-axis. The reason why the crystal orientation [01(-1)] is selected is as follows. It is known in the art that a silicon dioxide film formed on a GaAs layer in general formation conditions has compressive stress of about $1 \times 10^9$ dyne/cm$^2$. Thus, the passivation film 9 made of silicon dioxide and formed on the n type GaAs layer 3 induces compressive stress in GaAs crystal in the neighborhood of the gate electrode 6 to thereby induce piezoelectric charge, as having been reported in IEEE Transactions on electron devices, Vol. ED-31, No. 10, October 1984, pp. 1377–1380. The piezoelectric charge is fixed charge and has crystal orientation dependency. In particular, fixed charges to be induced in [01(-1)] and [011] orientations have common absolute values, but have opposite signs. It is also known in the art that the fixed charge causes transfer conductance to be varied. Accordingly, a conventional FET is designed to have [01(-1)] orientation so that transfer conductance thereof is maximized.

As an alternative, a doping profile of an active layer may be changed in order to enhance linearity of transfer conductance. FIG. 3 illustrates an example of a conventional FET including an active layer doping profile of which is changed.

The illustrated FET includes a semi-insulating GaAs substrate 1, a non-doped GaAs layer 2 formed on the substrate 1, an n type GaAs layer 3 formed on the non-doped GaAs layer 2 with a thickness of about 100 nm at and a dose of about $3.0 \times 10^{17}$ cm$^{-3}$ impurities, an n$^-$ type GaAs layer 4 which is formed on the n type GaAs layer 3 with a thickness of about 150 nm and a dose of about $5.0 \times 10^{16}$ cm$^{-3}$ impurities and which is formed with a recess, an n$^+$ GaAs layer 5 formed on the n$^-$ type GaAs layer 4, a gate electrode 6 formed in the recess formed in the n$^-$ type GaAs layer 4, a source electrode 7 and a drain electrode 8 both formed on the n$^+$ GaAs layer 5 so that the gate electrode 6 is disposed therebetween, and a silicon dioxide passivation film 9 covering exposed surfaces of the layers 4 and 5, the gate electrode 6, and the source and drain electrodes 7 and 8 therewith. Since the semiconductor active layer 4 disposed just beneath the gate electrode 6 is formed in a stepped structure, the linearity in transfer characteristic is enhanced, as has been reported in IEEE Transactions on Electron Devices, Vol. ED-25, No. 6, June 1978, pp. 600–605.

The firstly mentioned conventional FET has a problem in that the compressive stress induced in a passivation film induces piezoelectric charge in the vicinity of a gate electrode to thereby degrade the linearity and hence the strain characteristic of transfer conductance. Even if the doping profile of an active layer is shaped in a stepped structure, it is not possible to have sufficient linearity of transfer conductance, as has been explained in connection with the secondly mentioned conventional FET illustrated in FIG. 3.

SUMMARY OF THE INVENTION

In view of the foregoing problems of the conventional FETs, it is an object of the present invention to provide a field effect transistor which can enhance the linearity and hence strain characteristic of transfer conductance.

In one aspect, the present invention provides a field effect transistor including (a) a semi-insulating GaAs substrate, (b) a step-doped structured active layer including an n type GaAs layer formed on the substrate, and an n$^-$ type GaAs layer or a non-doped GaAs layer formed on the n type GaAs layer, the n$^-$ type GaAs layer or non-doped GaAs layer being formed with at least one recess, and (c) a gate electrode formed in the recess so that the gate electrode is oriented in such a direction that drain current runs in the active layer along crystal orientation [01(-1)].

The present invention provides a field effect transistor including (a) a semi-insulating GaAs substrate, (b) an n type GaAs layer deposited on the substrate, (c) an n$^-$ type GaAs layer or a non-doped GaAs layer deposited on the n type GaAs layer, the n$^-$ type GaAs layer or non-doped GaAs layer being formed with at least one recess extending along crystal orientation [011], and (d) a gate electrode formed in the recess so that gate electrode orientation thereof is [011].

The present invention provides a field effect transistor including (a) a semi-insulating GaAs substrate, (b) an n type GaAs layer deposited on the substrate, (c) an n$^-$ type GaAs layer or a non-doped GaAs layer deposited on the n type GaAs layer, (d) an n$^+$ type GaAs layer deposited on the n$^-$ type GaAs layer or non-doped GaAs layer, a first recess being formed so that the first recess passes through the n$^+$ type GaAs layer and terminates in the n$^-$ type GaAs layer or non-doped GaAs layer, a second recess being formed at a bottom surface of the first recess, both the first and second recesses extending along crystal orientation [011], (e) a gate electrode formed in the second recess, (f) source and drain electrodes disposed on the n$^+$ type GaAs layer so that the gate electrode is located therebetween, and (g) a passivation film covering exposed surfaces of a resultant.

In another aspect, the present invention provides a method of fabricating a field effect transistor including the steps of (a) preparing a semi-insulating GaAs substrate, (b) forming a step-doped structured active layer including an n type GaAs layer deposited on the substrate, and an n$^-$ type GaAs layer or a non-doped GaAs layer deposited on the n type GaAs layer, (c) forming the n⁻ type GaAs layer or non-doped GaAs layer with at least one recess, and (d) forming a gate electrode in the recess so that the gate electrode is oriented in such a direction that drain current runs in the active layer along crystal orientation [01(-1)].

The present invention further provides a method of fabricating a field effect transistor including the steps of (a) preparing a semi-insulating GaAs substrate, (b) depositing an n type GaAs layer on the substrate, (c) depositing an n⁻ type GaAs layer or a non-doped GaAs layer on the n type GaAs layer, (d) forming at least one recess at a surface of the n⁻ type GaAs layer or non-doped GaAs layer so that the recess extends along crystal orientation [011], and (e) forming a gate electrode in the recess.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENT

A preferred embodiment in accordance with the present invention will be explained hereinbelow with reference to drawings.

Figure 4:
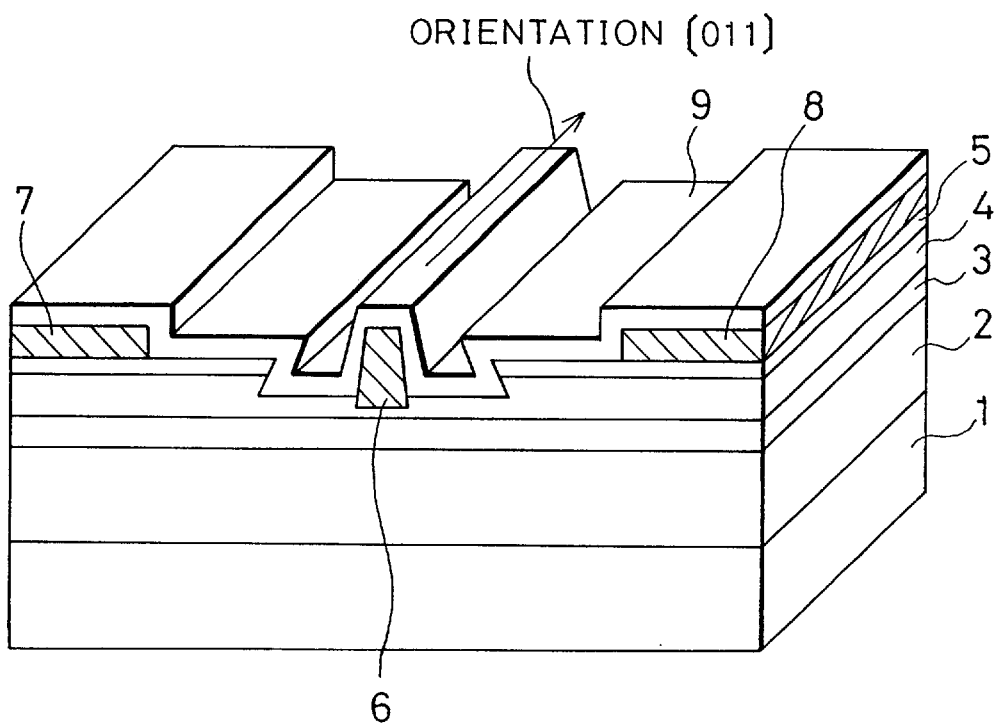
FIG. 4 is a perspective view illustrating a field effect transistor made in accordance with the embodiment of the present invention.

With reference to FIG. 4, on a semi-insulating GaAs substrate 1 is formed a non-doped GaAs layer 2. Then, on the non-doped GaAs layer 2 is formed a stepped doping structure by successively growing by MBE an n type GaAs layer 3 on the non-doped GaAs layer 2 with a thickness of about 100 nm and a dose of about $3.0 \times 10^{17}$ cm$^{-3}$ impurities, an n⁻ type GaAs layer 4 on the n type GaAs layer 3 with a thickness of about 150 nm and a dose of about $5.0 \times 10^{16}$ cm$^{-3}$ impurities, and an n⁺ GaAs layer 5 on the n⁻ type GaAs layer 4 at a dose of about $1.0 \times 10^{18}$ cm$^{-3}$ impurities.

Then, the n⁺ GaAs layer 5 and the n⁻ type GaAs layer 4 are selectively etched to thereby form a first recess extending in [011] crystal orientation. The first recess passes through the n⁺ GaAs layer 5 and terminates in the n⁻ type GaAs layer 4. Thereafter, the first recess is selectively etched at a bottom surface thereof to thereby form a second recess having a width of 0.5 μm which corresponds to a gate length of 0.5 μm. The second recess terminates in the n⁻ type GaAs layer 4 and does not reach the n type GaAs layer disposed just below the n⁻ type GaAs layer 4.

Then, a lift-off process is carried out to thereby selectively form in the second recess a gate electrode 6 made of an aluminum film and having gate electrode orientation [011]. Then, a source electrode 7 and a drain electrode 8 both made of an AuGe/Ni film are formed on the n⁺ GaAs layer 5 so that the gate electrode 6 is disposed therebetween. Then, a silicon dioxide passivation film 9 is deposited to cover exposed surfaces of the layers 4 and 5, the gate electrode 6, and the source and drain electrodes 7 and 8 therewith.

By causing the gate electrode 6 to have the orientation [011], drain current runs along [01(-1)] orientation in the above mentioned stepped doping structure composed of the layers 3, 4 and 5.

In the above mentioned embodiment, there are formed two recesses in the layers 4 and 5. However, it should be noted that there may be formed a single recess or three recesses or more. In addition, a non-doped GaAs layer may be substituted for the n⁻ type GaAs layer 4.

Figure 1:
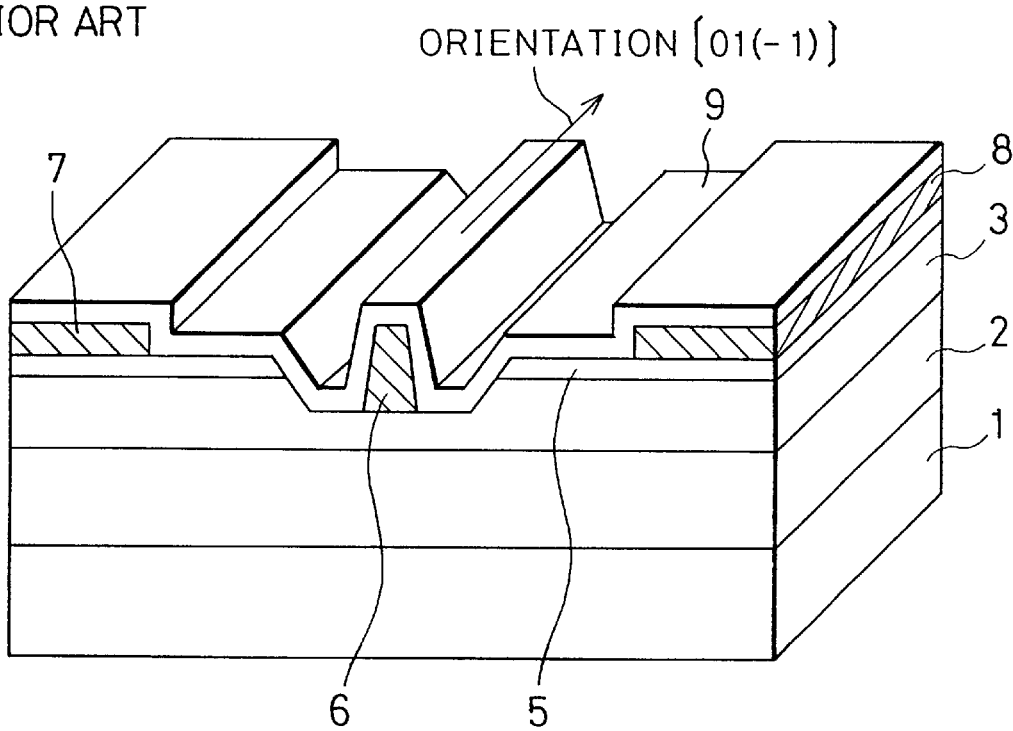
FIG. 1 is a perspective view illustrating a conventional field effect transistor.
Figure 2:
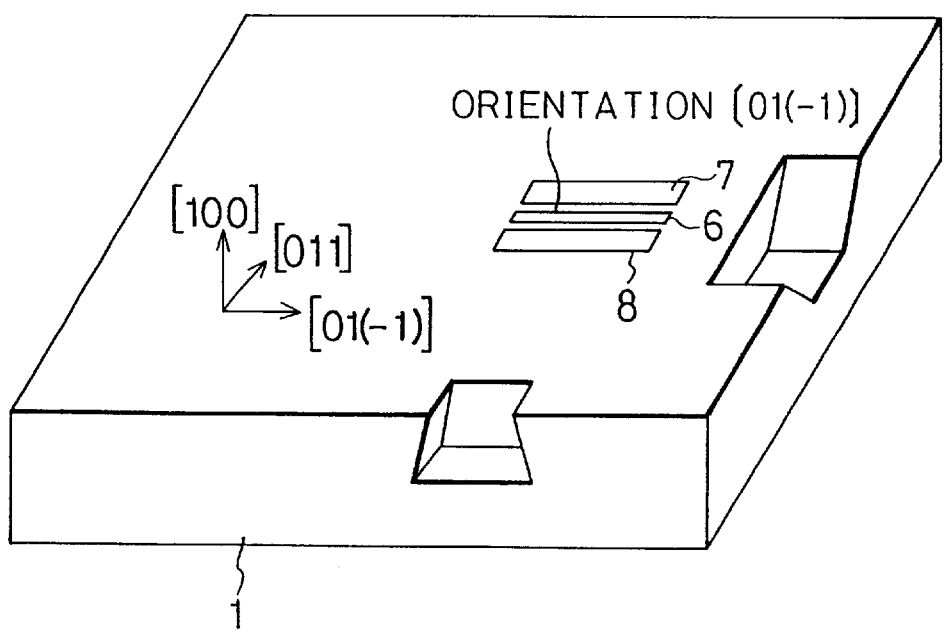
FIG. 2 is a perspective view showing crystal orientation.
Figure 3:
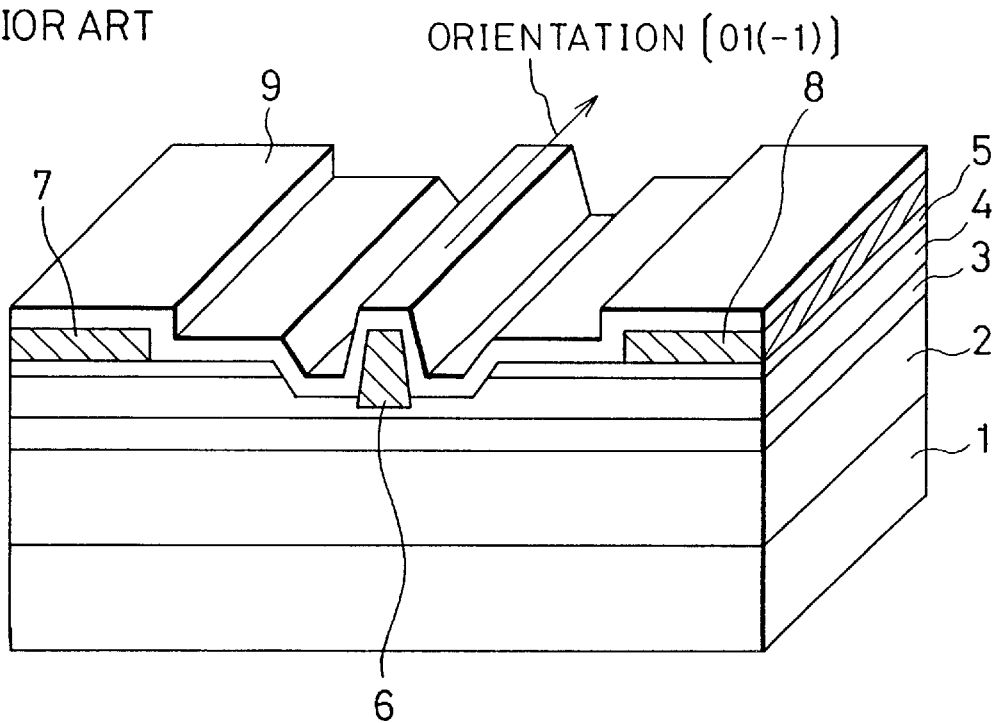
FIG. 3 is a perspective view illustrating another conventional field effect transistor.
Figure 5:
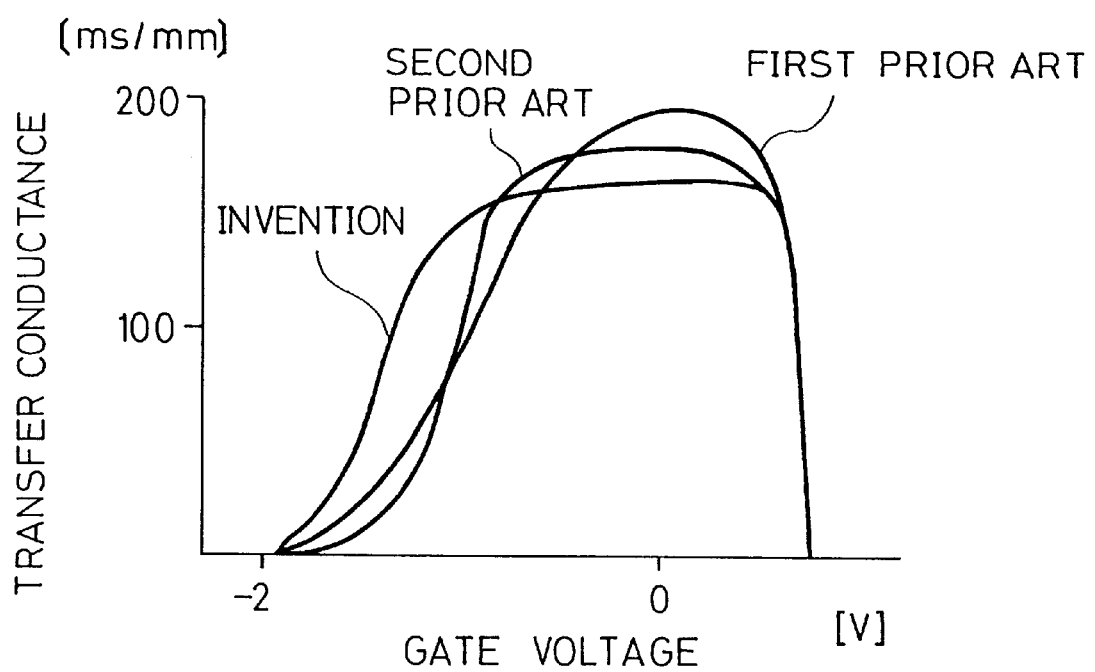
FIG. 5 is a graph showing transfer characteristic of the field effect transistor in comparison with that of conventional ones.

FIG. 5 illustrates transfer characteristic of the field effect transistor made in accordance with the present invention in comparison with the above mentioned two conventional field effect transistors. As is obvious in FIG. 5, the present invention provides significantly improved linearity of transfer characteristics relative to the two conventional FETs illustrated in FIGS. 1 and 3. Thus, the present invention accomplishes a field effect transistor having an improved strain characteristic.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A field effect transistor comprising:
   (a) a semi-insulating GaAs substrate;
   (b) a step-doped structured active layer including an n type GaAs layer formed on said substrate, and an n⁻ type GaAs layer or a non-doped GaAs layer formed on said n type GaAs layer, said n⁻ type GaAs layer or non-doped GaAs layer being formed with at least one recess; and
   (c) a gate electrode formed in said recess so that said gate electrode is oriented in such a direction that drain current runs in said active layer along crystal orientation [01(-1)].

2. The field effect transistor as set forth in claim 1 further comprising an n⁺ type GaAs layer formed on said n⁻ type GaAs layer or non-doped GaAs layer, said recess passing through said n⁺ type GaAs layer and terminating in said n⁻ type GaAs layer or non-doped GaAs layer.

3. The field effect transistor as set forth in claim 2, wherein a second recess is formed at a bottom surface of said recess, said second recess terminating in said n⁻ type GaAs layer or non-doped GaAs layer.

4. The field effect transistor as set forth in claim 1 further comprising a passivation film covering exposed surfaces of a resultant.

5. A field effect transistor comprising:
   (a) a semi-insulating GaAs substrate;
   (b) an n type GaAs layer deposited on said substrate;
   (c) an n⁻ type GaAs layer or a non-doped GaAs layer deposited on said n type GaAs layer, said n⁻ type GaAs layer or non-doped GaAs layer being formed with at least one recess extending along crystal orientation [011]; and
   (d) a gate electrode formed in said recess so that gate electrode orientation thereof is [011].

6. The field effect transistor as set forth in claim 5 further comprising an n⁺ type GaAs layer formed on said n⁻ type GaAs layer or non-doped GaAs layer, said recess passing through said $n^+$ type GaAs layer and terminating in said $n^-$ type GaAs layer or non-doped GaAs layer.

7. The field effect transistor as set forth in claim 6, wherein a second recess is formed at a bottom surface of said recess, said second recess terminating in said $n^-$ type GaAs layer or non-doped GaAs layer.

8. The field effect transistor as set forth in claim 5 further comprising a passivation film covering exposed surfaces of a resultant.

9. A field effect transistor comprising:

(a) a semi-insulating GaAs substrate;

(b) an n type GaAs layer deposited on said substrate;

(c) an $n^-$ type GaAs layer or a non-doped GaAs layer deposited on said n type GaAs layer;

(d) an $n^+$ type GaAs layer deposited on said $n^-$ type GaAs layer or non-doped GaAs layer, a first recess being formed so that said first recess passes through said $n^+$ type GaAs layer and terminates in said $n^-$ type GaAs layer or non-doped GaAs layer, a second recess being formed at a bottom surface of said first recess, both said first and second recesses extending along crystal orientation [011];

(e) a gate electrode formed in said second recess;

(f) source and drain electrodes disposed on said $n^+$ type GaAs layer so that said gate electrode is located therebetween; and (g) a passivation film covering exposed surfaces of a resultant.

* * * * *